(12) United States Patent
Tanada

(10) Patent No.: US 11,901,102 B2
(45) Date of Patent: Feb. 13, 2024

(54) COIL COMPONENT AND CIRCUIT BOARD HAVING SAME

(71) Applicant: TAIYO YUDEN CO., LTD., Tokyo (JP)

(72) Inventor: Atsushi Tanada, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 286 days.

(21) Appl. No.: 17/552,784

(22) Filed: Dec. 16, 2021

(65) Prior Publication Data

US 2022/0208422 A1 Jun. 30, 2022

(30) Foreign Application Priority Data

Dec. 25, 2020 (JP) ................. 2020-216209

(51) Int. Cl.

| | |
|---|---|
| *H01F 1/147* | (2006.01) |
| *H01F 27/255* | (2006.01) |
| *H01F 27/28* | (2006.01) |
| *H05K 1/18* | (2006.01) |
| *C22C 38/34* | (2006.01) |
| *B22F 3/16* | (2006.01) |
| *H01F 41/02* | (2006.01) |

(52) U.S. Cl.
CPC ............ *H01F 1/14766* (2013.01); *B22F 3/16* (2013.01); *C22C 38/34* (2013.01); *H01F 27/255* (2013.01); *H01F 27/28* (2013.01); *H01F 41/0246* (2013.01); *H05K 1/181* (2013.01); *B22F 2301/35* (2013.01); *C22C 2202/02* (2013.01); *H05K 2201/1003* (2013.01)

(58) Field of Classification Search
CPC ................ H01F 1/14766; H01F 27/28; H05K 2201/1003
See application file for complete search history.

(56) References Cited

U.S. PATENT DOCUMENTS

| | | | | |
|---|---|---|---|---|
| 2020/0105447 | A1* | 4/2020 | Nakajima | ........... H01F 1/14766 |
| 2020/0312513 | A1* | 10/2020 | Ishiwata | ................. C23C 24/02 |

FOREIGN PATENT DOCUMENTS

| | | |
|---|---|---|
| JP | 2007027354 A | 2/2007 |
| JP | 2020053542 A | 4/2020 |
| JP | 2020167296 A | 10/2020 |

* cited by examiner

*Primary Examiner* — Sherman Ng
(74) *Attorney, Agent, or Firm* — Law Office of Katsuhiro Arai

(57) ABSTRACT

A coil component includes: a magnetic base body formed by metal magnetic grains containing Fe, Si, and Cr, whose intensity ratio ($I_M/I_H$) of the strongest line intensity ($I_M$) in a range of wavenumbers 650 to 750 $cm^{-1}$, to the strongest line intensity ($I_H$) in a range of wavenumbers 400 to 450 $cm^{-1}$, in a Raman spectrum measured at the center part is 2 or higher, and which also has a part on the surface side of the center part where the intensity ratio ($I_M/I_H$) in a Raman spectrum is under 2; and a conductor placed inside or on the surface of the magnetic base body. The magnetic base body is constituted by a powder magnetic core made to have excellent electrical insulating property and high magnetic permeability.

8 Claims, 4 Drawing Sheets

COIL COMPONENT AND CIRCUIT BOARD HAVING SAME

CROSS-REFERENCE TO RELATED APPLICATIONS

The present application claims priority to Japanese Patent Application No. 2020-216209, filed Dec. 25, 2020, the disclosure of which is incorporated herein by reference in its entirety including any and all particular combinations of the features disclosed therein.

BACKGROUND

Field of the Invention

The present invention relates to a coil component and a circuit board having the same.

Description of the Related Art

In recent years, the drive for smaller, higher-performance mobile phones and other high-frequency communication systems calls for size reduction and performance enhancement of electronic components installed therein. In coil components such as inductors, achievement of high current flow is one guiding principle for performance enhancement. To meet these demands for size reduction and high current flow, metal magnetic materials that are more resistant to magnetic saturation than ferrite materials are finding applications as magnetic materials for use in coil components.

Metal magnetic materials are inferior to ferrite materials in electrical insulating property, so when they are used, oftentimes the grains formed by the metal magnetic materials are electrically insulated from each other by insulating materials to improve the electrical insulating property.

For example, Patent Literature 1 discloses a multi-layer electronic component comprising metal magnetic layers formed with a metal magnetic body paste that has been obtained by mixing an Fe—Cr—Si alloy powder with a borosilicate glass powder. In this multi-layer electronic component, the metal magnetic grains are bonded together via borosilicate glass to ensure electrical insulating property and mechanical strength.

Also, Patent Literature 2 discloses obtaining a magnetic base body by forming a silica film on the surface of metal magnetic grains according to the sol-gel method, followed by mixing these grains with a binder resin and producing magnetic body sheets from the resulting slurry, and then heat-treating a laminate body comprising the sheets in an atmosphere of 50 to 200 ppm in oxygen concentration. It is claimed that this magnetic base body achieves high volume resistivity because multiple metal magnetic grains are bonded via an oxide phase containing Si, and also because the oxide film provided on their surface contains more insulating hematite ($Fe_2O_3$) than magnetite ($Fe_3O_4$).

Furthermore, Patent Literature 3 discloses obtaining an inductor by forming soft magnetic metal grains having a composition of Fe—Si—Cr (Fe: 95% by weight, Si: 3.5% by weight, Cr: 1.5% by weight) into sheets, stacking and pressure-bonding these magnetic body sheets after forming conductor patterns thereon, followed by heat treatment in an atmosphere whose oxygen concentration varies. It is claimed that this inductor has high magnetic permeability and withstand voltage because its peak intensity ratio (M/H), which is the ratio of a peak present near wavenumber 712 $cm^{-1}$ (peak intensity M) and a peak present near wavenumber 1,320 $cm^{-1}$ (peak intensity H), is in a range of 1 to 70.

BACKGROUND ART LITERATURES

[Patent Literature 1] Japanese Patent Laid-open No. 2007-27354
[Patent Literature 2] Japanese Patent Laid-open No. 2020-167296
[Patent Literature 3] Japanese Patent Laid-open No. 2020-53542

SUMMARY

In the case of a powder magnetic core obtained by compacting a magnetic powder, as disclosed in Patent Literatures 1 to 3, increasing the fill rate of the metal magnetic grains constituting it leads to improvement of magnetic permeability.

However, the magnetic body in Patent Literature 1 in which the metal magnetic grains are bonded via glass, the fill rate of the metal magnetic grains decreases due to the thickness of the glass. Also, in the magnetic body in Patent Literature 2 obtained by forming a silica film on the surface of metal magnetic grains according to the sol-gel method, followed by compacting and then heat-treating the grains, it is difficult to achieve a high fill rate because a relatively thick insulating layer is formed between the metal magnetic grains.

On the other hand, electrically insulating the metal magnetic grains with a thin insulating layer in between to increase the fill rate of the metal magnetic grains requires that the insulating layer be formed with a material of high electrical resistivity.

The magnetic base body disclosed in Patent Literature 3 presents a problem in that its electrical insulating property decreases when the content percentage of conductive magnetite increases with respect to the content percentage of highly insulating hematite.

As described above, it is difficult for a powder magnetic core formed by metal magnetic grains to achieve both high electrical insulating property and high magnetic permeability.

Accordingly, an object of the present invention is to provide a coil component comprising, as a magnetic base body, a powder magnetic core having excellent electrical insulating property and high magnetic permeability. It should be noted that, in the present disclosure, the term "the invention" or "the present invention" may refer to at least one of the embodiments or aspects explicitly, necessarily, or inherently disclosed herein.

In the process of examining ways to solve the aforementioned problems, the inventor of the present invention came up with an concept that, by increasing the electrical insulating property of the magnetic base body near its surface adjacent to the conductor, the desired electrical insulating property could be achieved even though the electrical insulating property inside the magnetic base body away from the surface is somewhat low. Then, based on this concept, the inventor of the present invention successfully obtained a magnetic base body having a high content percentage of hematite ($Fe_2O_3$) with excellent electrical insulating property near the surface (which is higher than that in a region inner than a vicinity of the surface), while having a high content percentage of magnetite ($Fe_3O_4$) with excellent magnetic properties inside (which is higher than that near the surface), and after discovering that the aforementioned problems could be solved by this magnetic base body, eventually completed the present invention.

To be specific, the first aspect of the present invention to achieve the aforementioned object is a coil component comprising: a magnetic base body formed by metal magnetic grains containing Fe, Si, and Cr, whose intensity ratio ($I_M/I_H$) of the strongest line intensity ($I_M$) in a range of wavenumbers 650 to 750 cm$^{-1}$, to the strongest line intensity ($I_H$) in a range of wavenumbers 400 to 450 cm$^{-1}$, in a Raman spectrum measured at the center part is 2 or higher, and which also has a part on the surface side of the center part where the intensity ratio ($I_M/I_H$) in a Raman spectrum is less than 2.0 (preferably 1.5 or lower); and a conductor placed inside or on the surface of the magnetic base body.

Also, the second aspect of the present invention is a circuit board on which the coil component pertaining to the aforementioned first aspect is installed.

According to the present invention, a coil component can be provided that comprises, as a magnetic base body, a powder magnetic core having excellent electrical insulating property and high magnetic permeability (e.g., μ>40 at 1 MHz).

DESCRIPTION OF THE SYMBOLS

Figure 1:
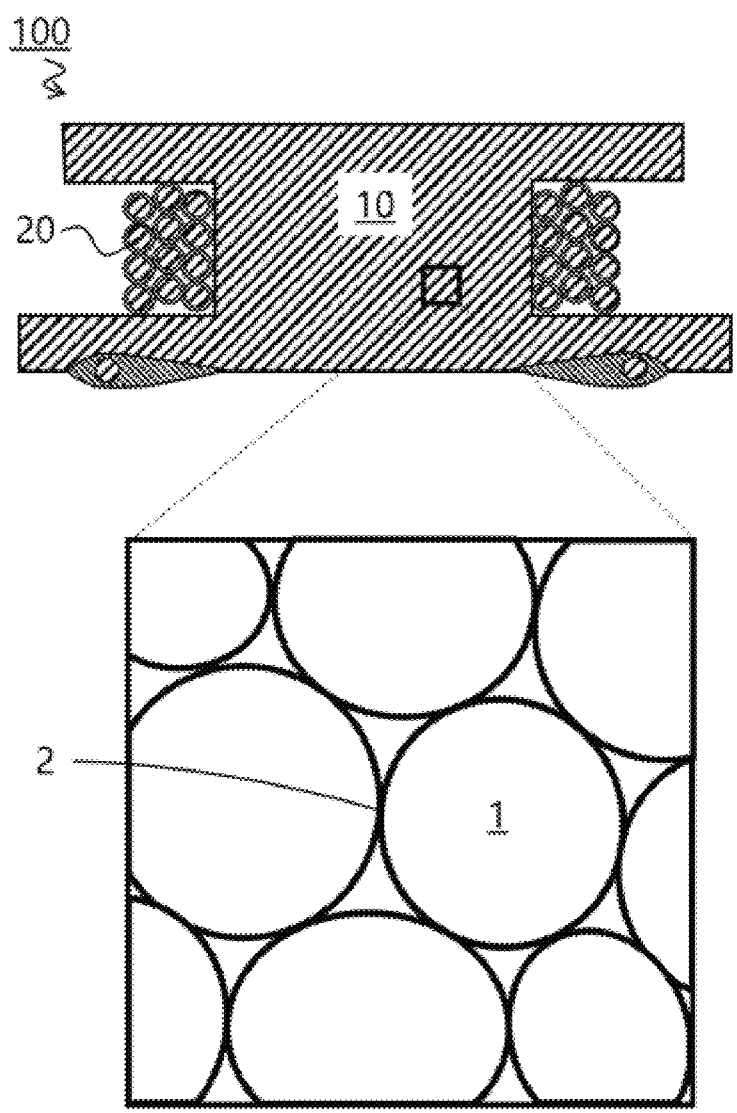
FIG. 1 is a schematic view showing the structure of the coil component pertaining to the first aspect of the present invention.

100 Coil component
10 Magnetic base body (powder magnetic core)
11 Center part of magnetic base body
1 Metal magnetic grain
2 Boding layer
20 Conductor
30 Mounting face
$G_1$ Center of gravity of mounting face
$G_2$ Center of gravity of measurement target face
d Shortest distance from center of gravity, to outer periphery, of measurement target face

DETAILED DESCRIPTION OF EMBODIMENTS

The constitutions as well as operations and effects of the present invention are explained below, together with the technical ideas, by referring to the drawings. It should be noted, however, that the mechanisms of operations include estimations and whether they are correct or wrong does not limit the present invention in any way. It should be noted that a description of numerical range (description of two values connected by "to") is interpreted to include the described values as the lower limit and the upper limit in some embodiments, and in other embodiments, the lower limit and/or the upper limit can be exclusive in the range.

[Coil Component]

Figure 6:
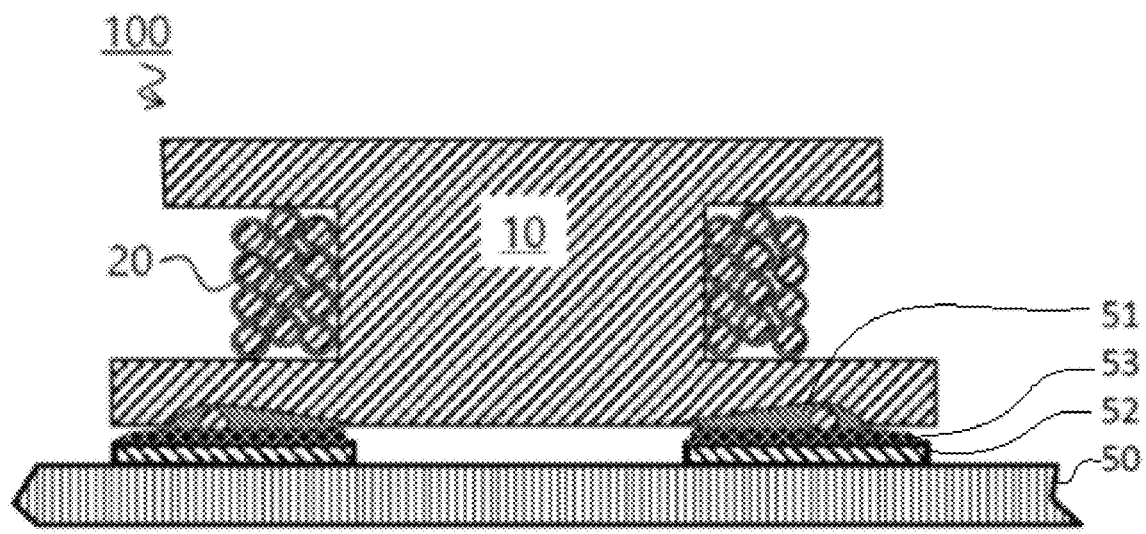
FIG. 6 is a schematic view showing the structure of a circuit board pertaining to another aspect of the present invention.

As shown schematically in FIG. 1, the coil component pertaining to the first aspect of the present invention (hereinafter also referred to simply as "first aspect") 100 is constituted by: a magnetic base body 10 formed by metal magnetic grains 1 containing Fe, Si, and Cr (e.g., an integrally molded body made of, e. g., a homogenous mixture the grains); and a conductor 20 placed inside or on the surface of the magnetic base body 10. It should be noted that, while FIG. 1 shows the shape of a conductive wire representing the conductor 20 wound around the surface of the magnetic base body 10, the first aspect is not limited to this shape. FIG. 6 is a schematic view showing the structure of a circuit board pertaining to another aspect of the present invention, which comprises, as a magnetic base body, the coil component 100 of FIG. 1 mounted on the circuit board 50 via an external electrode 51, an electrode 52, and a solder 53.

The metal magnetic grains 1 contain Fe as an essential component. Because the metal magnetic grains 1 contain Fe, the magnetic base body 10 can have high magnetic permeability and saturated magnetic flux density. The content of Fe in the metal magnetic grains 1 is not limited in any way so long as a magnetic base body 10 having the desired properties can be obtained. The higher the content of Fe, the higher the magnetic permeability and saturated magnetic flux density to be obtained, and therefore the content of Fe is preferably 80% by mass or higher, or more preferably 85% by mass or higher, or yet more preferably 90% by mass or higher. On the other hand, from the viewpoint of inhibiting magnetic properties from dropping due to oxidation of Fe or generation of eddy current, the content of Fe is preferably 99% by mass or lower, or more preferably 98% by mass or lower.

Also, the metal magnetic grains 1 contain Si as an essential component. Because the metal magnetic grains 1 contain Si, the electrical resistance increases and drop in the magnetic properties due to eddy current can be inhibited. The content of Si in the metal magnetic grains 1 is not limited in any way so long as a magnetic base body 10 having the desired properties can be obtained. From the viewpoint of fully demonstrating the effect of inhibiting eddy current, the content of Si is preferably 1% by mass or higher, or more preferably 1.5% by mass or higher. On the other hand, from the viewpoint of increasing the content of Fe in the metal magnetic grains 1 to achieve excellent magnetic properties, the content of Si is preferably 5% by mass or lower, or more preferably 4.5% by mass or lower.

Furthermore, the metal magnetic grains 1 contain Cr as an essential component. Because the metal magnetic grains 1 contain Cr that oxidizes more easily than Fe, oxidation of Fe contained in the grains is inhibited and high magnetic permeability and saturated magnetic flux density can be retained. The content of Cr in the metal magnetic grains 1 is not limited in any way so long as a magnetic base body 10 having the desired properties can be obtained. From the viewpoint of fully demonstrating the effect of inhibiting Fe oxidation, the content of Cr is preferably 0.5% by mass or higher, or more preferably 1% by mass or higher. On the other hand, from the viewpoint of increasing the content of Fe in the metal magnetic grains 1 to achieve excellent magnetic properties, the content of Cr is preferably 5% by mass or lower, or more preferably 4.5% by mass or lower.

The metal magnetic grains 1 may contain elements other than the aforementioned essential components to the extent that the object of the present invention can be achieved. Examples of elements that can be contained include Al, Ti, Zr, and the like.

Adjacent metal magnetic grains 1 in the magnetic base body 10 are bonded together by a boding layer 2. The boding layer 2 is formed as a result of oxidation of the elements contained in the metal magnetic grains 1, and contains one or multiple kinds of oxides containing at least one such element. Examples of oxides include hematite ($Fe_2O_3$), magnetite ($Fe_3O_4$), chromite ($FeCr_2O_4$), chrome oxide ($Cr_2O_3$), silicon dioxide ($SiO_2$), and the like.

The magnetic base body 10 is such that the intensity ratio ($I_M/I_H$) of the strongest line intensity ($I_M$) in a range of wavenumbers 650 to 750 $cm^{-1}$, to the strongest line intensity ($I_H$) in a range of wavenumbers 400 to 450 $cm^{-1}$, in a Raman spectrum measured at the center part is 2 or higher. This ensures that the magnetic base body 10 has high magnetic permeability. In a Raman spectrum, a peak that appears at wavenumbers 400 to 450 $cm^{-1}$ is attributable to hematite ($Fe_2O_3$). Also, in a Raman spectrum, peaks that appear at wavenumbers 650 to 750 $cm^{-1}$ are attributable to magnetite ($Fe_3O_4$) and chromite ($FeCr_2O_4$), respectively. It should be noted, however, that, because the content of Fe is much higher than the content of Cr in the metal magnetic grains 1, the content of chromite in the magnetic base body 10 becomes lower than that of magnetite. Accordingly, if a large peak appears in a range of wavenumbers 650 to 750 $cm^{-1}$, it can be argued that a majority of it is attributable to magnetite. Therefore, when the intensity ratio ($I_M/I_H$) of the strongest line intensity ($I_M$) in a range of wavenumbers 650 to 750 $cm^{-1}$, to the strongest line intensity ($I_H$) in a range of wavenumbers 400 to 450 $cm^{-1}$, in a Raman spectrum is 2 or higher, it means that the percentage of magnetite is higher than that of hematite at the measured location. Because magnetite is higher in magnetic permeability than is hematite, a high percentage of it leads to improved magnetic permeability of the magnetic base body 10. On the other hand, magnetite is inferior to hematite in terms of electrical insulating property, so a high percentage of it raises concerns for lower electrical insulating property; as discovered by the inventor of the present invention, however, any impact on electrical insulating property at the center part, which is farther away from the conductor in a coil component 100 form, is limited. From the viewpoint of increasing the magnetic permeability of the magnetic base body 10, the intensity ratio ($I_M/I_H$) is preferably 5 or higher, or more preferably 10 or higher, or yet more preferably 15 or higher. Although the upper-limit value of the intensity ratio ($I_M/I_H$) is not limited in any way, it is generally 100 or lower in a magnetic base body 10 obtained by a general method for manufacturing. Also, in the interest of achieving particularly high electrical insulating property, the upper-limit value of the intensity ratio ($I_M/I_H$) is generally 50 or lower in a magnetic base body 10 that has been heat-treated in an atmosphere of relatively high oxygen concentration.

The magnetic base body 10 is such that preferably the intensity ratio ($I_{Cr}/I_M$) of the strongest line intensity ($I_{Cr}$) in a range of wavenumbers 525 to 575 $cm^{-1}$, to the aforementioned strongest line intensity ($I_M$), in a Raman spectrum measured at the center part (preferably also at a part on the surface side of the center part) is 0.05 or lower (e.g., more than 0 and 0.04 or lower). This improves electrical insulating property further while keeping high magnetic permeability intact. In a Raman spectrum, a peak that appears at wavenumbers 525 to 575 $cm^{-1}$ is attributable to chrome oxide ($Cr_2O_3$). Accordingly, when the aforementioned intensity ratio ($I_{Cr}/I_M$) is 0.05 or lower, it means that the percentage of chrome oxide to the total of magnetite and chromite is low. Because Cr in the boding layer 2 is present predominantly as chrome oxide or chromite, a lower percentage of chrome oxide increases the percentage of chromite. Chromite contains bivalent Fe and trivalent Cr, and requires less oxygen for its production compared to chrome oxide constituted by trivalent Cr alone. This means that, compared to when only chrome oxide is present, the amount of oxygen consumed for the production of an oxide containing Cr decreases, and the oxygen contributing to the production of an oxide of Fe increases correspondingly. The result is an increase, albeit slightly, in the percentage of hematite that requires more oxygen for its production compared to magnetite. This slight increase in the percentage of hematite allows for manifestation of superior electrical insulating property while keeping high magnetic permeability intact. Therefore, the magnetic base body 10 will have high magnetic permeability and excellent electrical insulating property when the aforementioned intensity ratio ($I_{Cr}/I_M$) is low.

In some embodiments, the intensity ratio ($I_M/I_H$) is treated as a primary parameter wherein there is a clear nexus between the parameter at the center part and the relevant property (such as high magnetic permeability) while the parameter is lower than 2 at a part on the surface side of the center part. Further, in some embodiments, the intensity ratio ($I_{Cr}/I_M$) is treated as a secondary parameter wherein there is a clear nexus between the parameter at the center part and the relevant property (such as high magnetic permeability) while the primary parameter at the center part is 2 or higher. Even when the atmosphere to which a magnetic base body is exposed for sintering the magnetic base body is the same, the primary parameter at the center part may vary depending on, e.g., the size, shape, specific surface area, and/or density of the magnetic base body and the duration of sintering treatment (resulting in varying the oxygen partial pressure, the temperature at the center part, and the duration of oxidizing reaction), because magnetite is formed and stably exists when being exposed to oxygen having a partial pressure of roughly $10^{-15}$ to $10^{-10}$ atm, whereas hematite is formed and stably exists when being exposed to oxygen having a partial pressure higher than the above, at a temperature of, e.g., roughly 800° C., so that when the magnetic base body is exposed to an atmosphere having sufficient oxygen (e.g., 800 ppm), the surface of the magnetic base body forms hematite whereas oxygen supplied/penetrating through the surface from the atmosphere is less and less toward the center part, and thus, a part more away from the surface toward the center part more seriously undergoes oxygen deficiency, beginning forming magnetite rather than hematite.

Further, even when the primary parameter at the center part is the same, the secondary parameter at the center part may vary depending on, e.g., the above process parameters, since Cr is more easily oxidized than Fe, and thus, the secondary parameter is more sensitively responsive to the changes in the oxygen partial pressure, the temperature at the center part, and the duration of oxidizing reaction. Accordingly, by adjusting the secondary parameter at the center part within a range of 0.05 or less (e.g., more than 0 but less than 0.04) while keeping the primary parameter in a range of 2 or higher, the oxidating conditions can be properly controlled.

The magnetic base body 10 has a part on the surface side of the center part where the aforementioned intensity ratio ($I_M/I_H$) in a Raman spectrum is under 2. This allows the magnetic base body 10 to have excellent electrical insulating property at the surface to prevent current from flowing to the inside, and when used in a coil component 100, to achieve sufficient electrical insulating property. This is because the percentage of hematite having excellent electrical insulating property is high in the aforementioned part on the surface side. From the viewpoint of obtaining superior electrical insulating property, preferably the intensity ratio ($I_M/I_H$) is lower, such as under 1.5, for example. The intensity ratio ($I_M/I_H$) can be under 1.0 for a magnetic base body 10 obtained through a heat treatment at 600° C. or higher in air according to a general method for manufacturing. Under such general method for manufacturing, however, the intensity ratio ($I_M/I_H$) becomes roughly the same as on the surface side even at the center part of the magnetic base body 10, and the structure of the first aspect where the intensity ratio ($I_M/I_H$) at the center part is 2 or higher while at the same time the intensity ratio ($I_M/I_H$) varies significantly between the surface side and the center part (such as a difference in ($I_M/I_H$) between the surface side and the center part being preferably 0.5 or more, more preferably 0.9 or more), cannot be achieved. It should be noted that, while the intensity ratio ($I_M/I_H$) takes a range that includes cases where $I_M$ is greater than $I_H$ strictly from the magnitude relationship of $I_M$ and $I_H$, $I_M$ represents the total of the peak intensity of magnetite and peak intensity of chromite, as described above, and therefore the percentage of magnetite is still sufficiently small in such cases (i.e., although electrical insulating property of magnetite is not as good as that of hematite, the proportion of magnetite is sufficiently small for manifesting excellent electrical insulating property when the magnetic base body is used for a coil component).

Figure 2:
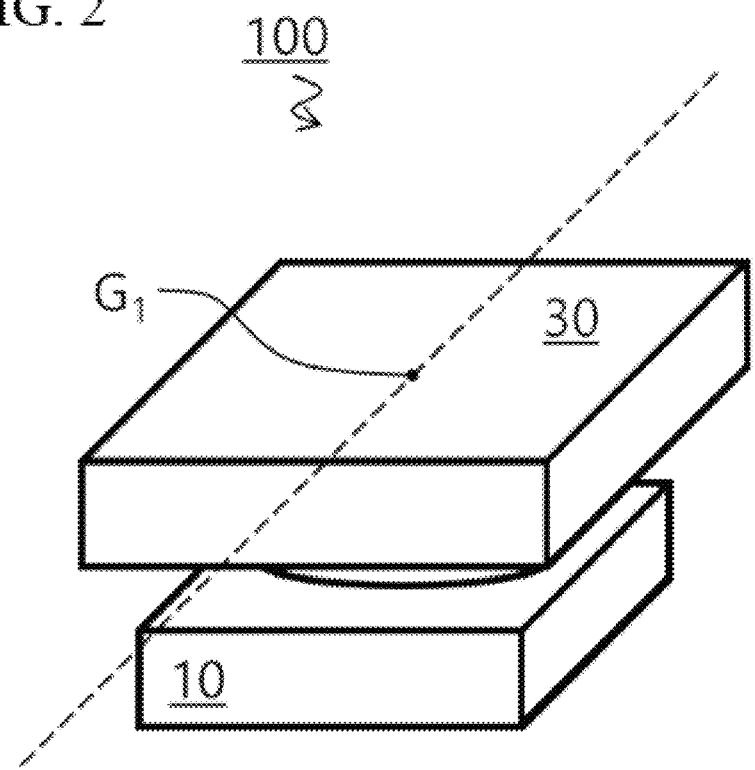
FIG. 2 is an explanatory drawing showing the method for preparing a Raman spectral measurement sample of the magnetic base body in the first aspect of the present invention.
Figure 3:
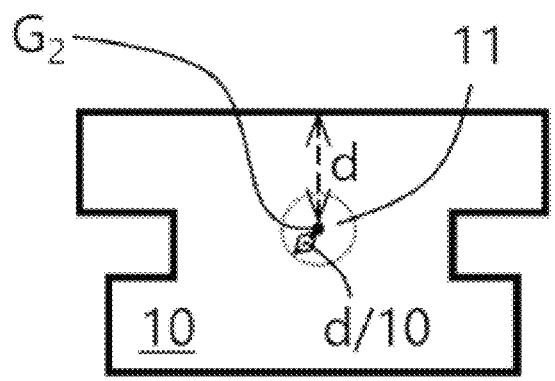
FIG. 3 is an explanatory drawing showing the method for determining the center part and surface side of the magnetic base body in the first aspect of the present invention.

Now, Raman spectral measurement at the center part of, and on the surface side thereof, in the magnetic base body 10, as well as calculation of each of the aforementioned strongest line intensity ratios based thereon, are performed according to the following procedure. First, as shown in FIG. 2, the center of gravity $G_1$ is geometrically determined for a mounting face 30 of the coil component 100, and the coil component 100 is cut along a randomly selected plane passing through the center of gravity $G_1$ and orthogonal to the mounting face 30. This cut may be performed on the magnetic base body 10 obtained by disassembling the coil component 100. Next, as shown in FIG. 3, the center of gravity $G_2$ of the cross-section (measurement target face) of the magnetic base body 10 revealed by the cut is geometrically determined, and the shortest distance d from there to the outer periphery of the measurement target face is calculated. Next, the region on the measurement target face having a distance from the center of gravity $G_2$ of within d/10 is designated as a center part 11 of the magnetic base body 10. Next, Raman spectral measurement is performed separately on one randomly selected point positioned at the center part 11 as well as a point or points randomly selected at a part on the surface side positioned on the outer side thereof. In the region on the surface side of the center part 11, it suffices that at least one point exists where the aforementioned intensity ratio ($I_M/I_H$) can be achieved, and therefore multiple points may be measured for calculation/confirmation of the intensity ratio ($I_M/I_H$). It should be noted that, since the intensity ratio ($I_M/I_H$) tends to decrease at a point closer to the surface of the magnetic body, preferably points near the outer periphery of the measurement target face, such as those whose distance from the outer periphery is within d/10, are taken as measurement points in the interest of reducing the number of measurement points and thus completing the measurements quickly. Also, regarding the measurement points on the surface side, points on the surface of the magnetic base body 10 may be adopted instead of the aforementioned points in the measurement target face if no part exists on the surface of the magnetic base body 10 where the material is different from the inside, such as resin or other foreign object. In some embodiments, the intensity ratio ($I_M/I_H$) gradually or continuously decreases from the center part toward the surface of the magnetic base body (except minor fluctuations, measurement error, e.g., when using a least-squares approximation method; also except the very surface which is often, but not always, more reactive) in a randomly selected radial direction.

Measurement is performed with a laser Raman spectrometer (NRS-3300, manufactured by JASCO Corporation) using a laser beam of wavelength 488 nm as the excitation light source, with the dimmer open and the exposure time and number of integrations set to 300 seconds and 2, respectively. It should be noted that, instead of the aforementioned measuring system and measurement conditions, a measuring system and measurement conditions that can achieve roughly the same levels of measurement/analysis accuracies may be adopted. Next, from the obtained measurement results, the maximum intensities in the respective ranges of wave numbers 400 to 450 $cm^{-1}$, 650 to 750 $cm^{-1}$, and 525 to 575 $cm^{-1}$ are read off and a baseline value is calculated for the respective ranges, and the values obtained by subtracting the baseline value from the maximum intensities are designated as the strongest line intensities $I_H$, $I_M$, and $I_{Cr}$, respectively. Lastly, the strongest line intensity ratios $I_M/I_H$ and $I_{Cr}/I_M$ are calculated from the obtained strongest line intensities.

It should be noted that measurement on the exposed surface of the magnetic base body is more influenced by the atmosphere to which the surface of the magnetic base body is directly exposed, than is a part under the surface, particularly when a specific surface area of the magnetic base body is relatively large, manifesting more reactive results.

In some embodiments, the magnetic base body may be constituted by a shaft part and flange parts attached to both ends of the shaft part, which may be formed as a single-piece compact composed of a same material or may be formed separately and assembled/combined as an assembled compact, and in any event, the surface side and the center part may be defined for a shaped compact subjected to sintering treatment as a single piece.

When the magnetic base body is in a ring shape or the like, the center part is not a center part of the ring itself, which will be a center of the ring (a void), but is a center part of a cross-section of a solid part cut in a radial direction.

In the first aspect, a cross-section of the magnetic base body 10 can be visually observed to confirm, in a simple manner, that it has the desired properties (e.g., excellent electrical insulating property and high magnetic permeability). In the magnetic base body 10 having the desired properties, visually observing the aforementioned Raman spectral measurement target face finds a part having a color different from the black peripheral part, assuming a yellowish hue on top of black, at the center of the face. Accordingly, presence of this black part assuming a yellowish hue may be used to determine, as a simple determination method, that the magnetic base body 10 constitutes the first aspect.

Regarding the first aspect, the dimensions and shape of the magnetic base body 10 are not limited in any way and may be determined as deemed appropriate according to the required properties. The greater the dimensions and more isotropic the shape, that is, the greater the distance between the surfaces, the more preferred they are because high electrical insulating property can be retained even when a part with a high percentage of magnetite exists at the center part. Examples of particularly preferred dimensions/shapes of the magnetic base body 10 include those characterized by a cross-section orthogonal to the mounting face 30 of the coil component 100 having a width and a height of 1.0 mm or more, and others characterized by this cross-section having a cross-section area of 2.0 mm$^2$ or more, and the like.

The material, shape, and placement of the conductor 20 used in the first aspect are not limited in any way and may be determined as deemed appropriate according to the required properties. Examples of materials include silver, copper, and alloys thereof, and the like. Also, examples of shapes include straight, meandering, flat coiled, helical, etc. Furthermore, examples of placements include winding a sheathed conductive wire around the magnetic base body 10, embedding a conductor 20 having any of various shapes into the magnetic base body 10, and the like.

In the first aspect explained above, the magnetic base body 10 demonstrates high magnetic permeability and excellent electrical insulating property because it has a structure where the percentage of magnetite is high at the center part 11, while the percentage of hematite is high near the surface. This makes the first aspect a high-performance coil component.

[Method for Manufacturing Coil Component 1]

The coil component pertaining to the aforementioned first aspect is manufactured by forming into a compact a metal magnetic powder constituted by metal magnetic grains containing Fe, Si, and Cr, heat-treating the compact in a low-oxygen atmosphere to obtain a magnetic base body, and placing a conductor on the surface of the magnetic base body. This method for manufacturing is hereinafter also referred to as "First Method for Manufacturing."

The metal magnetic powder used in the first method for manufacturing is constituted by metal magnetic grains containing Fe, Si, and Cr. Preferred content of the respective elements in the metal magnetic grains are the same as those in the metal magnetic grains in the first aspect. Metal magnetic grains with a higher content of Fe, or specifically those with a content of Fe of 90% by mass or higher, undergo plastic deformation easily. This means that the grains will deform under pressure during the compacting mentioned below to fill the voids, thereby allowing a compact with a high fill rate to be obtained easily, which is desired. Specifically, a compact with a high fill rate increases the percentage of the metal magnetic grains in the magnetic base body to be obtained, and high magnetic permeability will be achieved as a result. Additionally, the amount of oxygen reaching the center part of the compact during the heat treatment mentioned below will decrease, thereby increasing the production amount of magnetite, an oxide of Fe, in which the percentage of oxygen is lower than that of Fe, and this also contributes to improvement of the magnetic permeability of the magnetic base body.

The method for compacting the metal magnetic powder is not limited in any way and, for example, one method is to feed the metal magnetic powder into dies or other molds and then apply pressure with a press, etc., thereby causing the metal magnetic grains constituting the metal magnetic powder to undergo plastic deformation, to obtain a compact.

Under the method for compacting using a press, a mixture obtained by mixing the metal magnetic powder with a resin may be press-formed, followed by curing of the resin, to produce a compact. Besides the above, a method of stacking and pressure-bonding green sheets containing the metal magnetic powder may also be adopted.

When obtaining a compact through press-forming using dies, etc., the press conditions may be determined as deemed appropriate according to the types of the metal magnetic powder and resin to be mixed therewith, compounding percentages thereof, and the like.

The resin mixed with the metal magnetic powder is not limited in any way so long as it can bond the metal magnetic powder grains together into a shape and retain the shape, and will also volatilize without leaving carbon content, etc., behind in the deresination (binder removal) process mentioned below. Examples include acrylic resins, butyral resins, vinyl resins, etc., whose decomposition temperature is 500° C. or lower. Also, a lubricant, representative examples of which include stearic acid or salt thereof, phosphoric acid or salt thereof, and boric acid or salt thereof, may be used together with, or instead of, the resin. The additive quantity of the resin and/or lubricant may be determined as deemed appropriate in consideration of the formability, shape retainability, etc., such as 0.1 to 5 parts by mass relative to 100 parts by mass of the metal magnetic powder, for example.

When obtaining a compact by stacking and pressure-bonding green sheets, a method may be adopted whereby the individual green sheets are stacked using a suction transfer machine, etc., and then thermally bonded using a press machine. To obtain multiple coil components from the pressure-bonded laminate body, the laminate body may be divided using a dicing machine, laser cutting machine or other cutting machine.

In this case, green sheets are typically manufactured by applying a slurry containing the metal magnetic powder and a binder on the surface of plastic films or other base films using a doctor blade, die coater, or other coating machine, and then drying the slurry. The binder used is not limited in any way so long as it can compact the metal magnetic powder into a sheet shape and retain the shape, and can also be removed by heating without leaving carbon content, etc., behind. Examples include polyvinyl butyral and other polyvinyl acetal resins, etc. The solvent with which to prepare the slurry is not limited in any way, either, and butyl carbitol or other glycol ether, etc., may be used. The content of each component in the slurry may be adjusted as deemed appropriate according to the adopted method for forming green sheets, thickness of the green sheets to be prepared, and so on.

Under the first method for manufacturing, the compact of metal magnetic powder is given the heat treatment mentioned below; if the compact contains resin or other organic matter, however, a binder removal process is performed to remove it prior to the heat treatment. The conditions for the binder removal process are not limited in any way so long as the binder can be removed while inhibiting oxidation of the metal magnetic grains in the compact. Examples include keeping the compact in air at a temperature of 200 to 400° C. for 30 minutes to 5 hours.

The compact of metal magnetic powder is heat-treated in a low-oxygen atmosphere following the aforementioned binder removal process performed as necessary. This oxidizes the elements contained in the metal magnetic grains to form a boding layer that allows the metal magnetic grains to bond together and turn into a magnetic base body.

The oxygen concentration in the atmosphere during heat treatment is not limited in any way so long as a magnetic base body having the desired properties can be obtained at applicable heat treatment temperatures and heat treatment periods. In general, the higher the oxygen concentration in the atmosphere, the easier it becomes to obtain a boding layer through heat treatment at low temperature over a short period; at the same time, however, oxidation progresses at the center part of the compact in the same manner as near the surface, and the magnetic base body will become one of lower magnetite percentage, which will likely result in lower magnetic permeability. Accordingly, when determining an oxygen concentration in the atmosphere with the aim of ensuring that the magnetic base body will have a structure where the percentage of magnetite is high at the center part, while the percentage of hematite is high near the surface, this general trend should be considered to select an oxygen concentration suitable for the magnetic base body to be manufactured. Examples of oxygen concentrations that likely provide a magnetic base body having excellent electrical insulating property along with high magnetic permeability, include 200 to 3,000 ppm.

The heat treatment temperature during heat treatment is not limited in any way, either, so long as a magnetic base body having the desired properties can be obtained at applicable oxygen concentrations in the atmosphere and heat treatment periods. In general, the higher the heat treatment temperature, the easier it becomes to obtain a boding layer through a heat treatment in a low-oxygen atmosphere over a short period; at the same time, however, oxidation of Fe progresses excessively and the percentage of Fe in the metal magnetic grains drops, which will likely result in lower magnetic permeability. This general trend should be considered to select a heat treatment temperature suitable for the magnetic base body to be manufactured. Examples of heat treatment temperatures that likely provide a magnetic base body having excellent electrical insulating property along with high magnetic permeability, include 750 to 850° C.

The heat treatment period of heat treatment is not limited in any way, either, so long as a magnetic base body having the desired properties can be obtained at applicable oxygen concentrations in the atmosphere and heat treatment temperatures. In general, the longer the heat treatment period, the easier it becomes to obtain a boding layer through a heat treatment in low-oxygen atmosphere at low temperature; at the same time, however, the time required for manufacturing becomes longer and productivity drops as a result. Also, generally a longer heat treatment period allows the progress of oxidation at the center part of the compact to catch up with the progress of oxidation near the surface of the compact, thereby causing the oxides in the boding layer to exist at similar percentages near the surface and at the center, the result of which is a magnetic base body in which the percentage of magnetite is equally lower in both areas and whose magnetic permeability is consequently lower. Accordingly, to ensure that the magnetic base body will have a structure where the percentage of magnetite is high at the center part, while the percentage of hematite is high near the surface, this general trend should be considered to select a heat treatment period suitable for the magnetic base body to be manufactured. Examples of heat treatment periods that likely form a boding layer having the desired composition to a sufficient thickness, include 30 minutes to 3 hours.

The aforementioned binder removal process and heat treatment may be performed continuously using a single heat treatment system that permits changing of atmosphere and temperature settings, or non-continuously using different heat treatment systems.

When a conductor is placed on its surface, the magnetic base body obtained through heat treatment becomes a coil component. Examples of specific methods for placement include a method of winding a sheathed conductive wire around the magnetic base body, and a method of placing a precursor to a conductor via printing of a conductor paste, etc., on the surface of the magnetic base body, followed by a baking process using a sintering furnace or other heating system.

[Method for Manufacturing Coil Component 2]

The coil component pertaining to the aforementioned first aspect may be manufactured by forming a metal magnetic powder constituted by metal magnetic grains containing Fe, Si, and Cr, as well as a conductor or precursor thereto, and then processing the powder into a compact having the conductor or precursor thereto placed inside, and heat-treating the compact in an oxygen atmosphere. This method for manufacturing is hereinafter also referred to as "Second Method for Manufacturing."

The metal magnetic powder used is the same as that under the aforementioned first method for manufacturing, and therefore not explained. Also, regarding the method for compacting the metal magnetic powder, press-forming or a method of stacking and pressure-bonding green sheets may be adopted, just like under the aforementioned first method for manufacturing.

Under the second method for manufacturing, a conductor or precursor thereto is placed inside the compact of metal magnetic powder. Here, a "conductor" refers to something that directly functions as a conductive path in a coil component, while a "precursor to a conductor" refers to something that contains a conductive material to become a conductor in a coil component, as well as a binder resin, etc., and will become a conductor through heat treatment. Regarding the method for placing the conductor or precursor thereto, a method whereby the metal magnetic powder is filled in dies in which the conductor or precursor thereto has been placed beforehand, and then pressed, may be adopted if the compact is to be obtained by press-forming. Also, if the compact is to be obtained by stacking and pressure-bonding green sheets, a method whereby the green sheets are stacked and pressure-bonded after the precursor to a conductor has been placed on them through printing of a conductor paste, etc., may be adopted.

When placing the precursor to a conductor using a conductor paste, the conductor paste used may be one containing a conductor powder and an organic vehicle. For the conductor powder, a powder of silver, copper, or alloy thereof, etc., is used. The grain size of the conductor powder is not limited in any way, but a powder whose average grain size (median diameter ($D_{50}$)) as calculated from the granularity distribution measured on volume basis is 1 µm to 10 µm is used, for example. The composition of the organic vehicle should be determined by considering the compatibility with the binder contained in the green sheets. One example is an organic vehicle obtained by dissolving or swelling polyvinyl butyral (PVB) or other polyvinyl acetal resin in butyl carbitol or other glycol ether-based solvent. The compounding ratios of the conductor powder and organic vehicle in the conductor paste may be adjusted as deemed appropriate according to a paste viscosity suitable for the printer used, film thickness of the conductor patterns to be formed, and so on.

Under the second method for manufacturing, the conditions for the heat treatment performed on the compact, as well as for the binder removal process performed as necessary prior to the heat treatment, are the same as those under the aforementioned first method for manufacturing, and therefore not explained.

[Circuit Board]

The circuit board pertaining to the second aspect of the present invention (hereinafter also referred to simply as "second aspect") is a circuit board on which the coil component pertaining to the aforementioned first aspect is installed.

The structure, etc., of the circuit board are not limited, and any circuit board appropriate for the purpose may be adopted.

The second aspect permits performance enhancement and size reduction owing to use of the coil component pertaining to the first aspect.

EXAMPLES

The present invention is explained more specifically below using examples; however, the present invention is not limited to these examples.

Example 1

(Manufacturing of Magnetic Base Body)

A metal magnetic powder of 6.0 μm in average grain size, having a composition of Fe-3.5 Si-1.5 Cr (the values indicate percent by mass, and the remaining is constituted by Fe and unavoidable/insubstantial impurities), was prepared. Next, this metal magnetic powder was mixed under agitation with 1.5% by mass of acrylic binder, to prepare a compacting material. Next, this compacting material was put in dies and uniaxially pressed under a pressure of 8 t/cm², to obtain a ring-shaped compact of 10.0 mm in outer diameter, 4.0 mm in inner diameter, and 3.0 mm in thickness. Next, the obtained compact was placed for 1 hour in a thermostatic chamber controlled at 150° C. to cure the binder. Lastly, the binder-cured compact was de-bindered at 350° C. for 2 hours in the air, after which the compact was heat-treated at 800° C. for 1 hour in a $N_2$—$O_2$ mixed atmosphere ($O_2$ concentration 800 ppm), to obtain the magnetic base body pertaining to Example 1. Since the dimensions of the rectangular cross-section obtained by cutting the magnetic base body in the diameter direction of the ring were 3.0 mm in both the longitudinal direction and lateral direction, the cross-section area of the magnetic base body was calculated as 9.0 mm².

(Raman Spectrometry of Magnetic Base Body)

Figure 4:
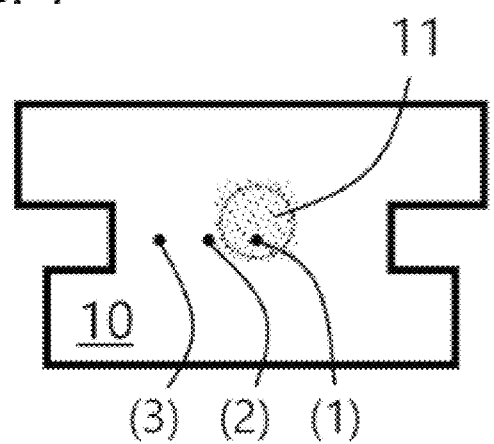
FIG. 4 is an explanatory drawing showing the Raman spectral measurement positions in the magnetic base body shown in FIG. 3.
Figure 5:
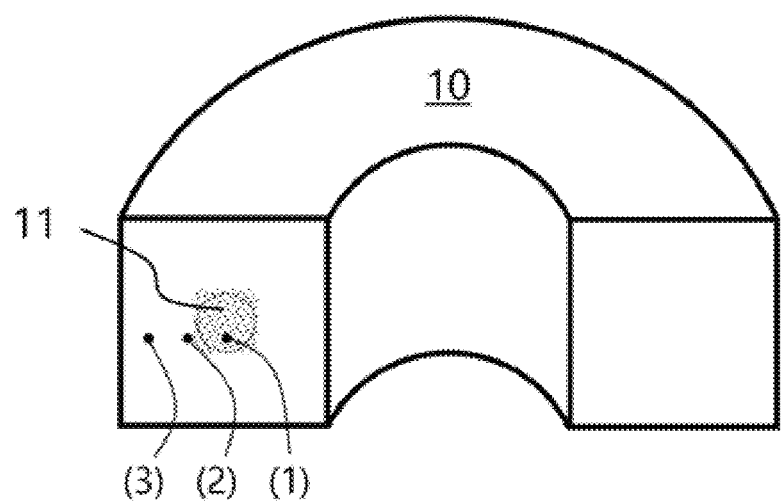
FIG. 5 is an explanatory drawing showing the Raman spectral measurement positions in the Examples and Comparative Examples of the present invention.

The obtained magnetic base body was measured for Raman spectrum at the center part 11 and the surface side thereof using a laser Raman spectrometer (NRS-3300, manufactured by JASCO Corporation) according to the aforementioned method, to calculate the strongest line intensity ratios $I_M/I_H$ and $I_{Cr}/I_M$, respectively. The measurement positions in the measurement target face consisted of total three locations, including one location in the center part 11 denoted by (1) in FIG. 5, and two locations on the surface side denoted by (2) and (3) in the same figure. Additionally, Raman spectral measurement was performed on the surface of the magnetic base body, aside from the measurement target face, to calculate the strongest line intensity ratios $I_M/I_H$ and $I_{Cr}/I_M$, respectively. The values of $I_M/I_H$ and $I_{Cr}/I_M$ obtained at the respective measurement positions are summarized and shown in Table 2. It should be noted that, on the measurement target face, the region denoted by dots in FIG. 5 was observed as a part assuming a yellowish hue. It should be noted that if the magnetic base body has the shape illustrated in FIG. 2, the measurement locations (1) to (3) are set as shown in FIG. 4.

(Manufacturing of Coil Component and Measurement of Specific Magnetic Permeability)

The obtained magnetic base body was wound with a conductive wire by 20 turns for use as the coil component pertaining to Example 1. This coil component was measured for specific magnetic permeability using an impedance analyzer (E4990A, manufactured by Keysight Technologies Inc.) at room temperature under the conditions of 500 mV in OSC level and 1 MHz in frequency. The obtained specific magnetic permeability was 52.

Examples 2 to 4

(Manufacturing of Magnetic Base Bodies)

The magnetic base bodies pertaining to Examples 2 to 4 were obtained in the same manner as in Example 1, except that the dimensions/shape of the compact were changed to a ring shape of 9.0 mm in outer diameter, 4.0 mm in inner diameter, and 2.5 mm in thickness (Example 2), ring shape of 8.0 mm in outer diameter, 4.0 mm in inner diameter, and 2.0 mm in thickness (Example 3), and ring shape of 7.0 mm in outer diameter, 4.0 mm in inner diameter, and 1.5 mm in thickness (Example 4), respectively. The dimensions of the rectangular cross-section obtained by cutting the magnetic base body in the diameter direction of the ring, and the cross-section area of the magnetic base body, were 2.5 mm in both the longitudinal direction and lateral direction with the cross-section area being 6.25 mm² (6.3 mm² as 2-digit accuracy) in Example 2, 2.0 mm in both the longitudinal direction and lateral direction with the cross-section area being 4.0 mm² in Example 3, and 1.5 mm in both the longitudinal direction and lateral direction with the cross-section area being 2.25 mm² (2.3 mm² as 2-digit accuracy) in Example 4.

(Raman Spectrometry of Magnetic Base Bodies)

Each of the obtained magnetic base bodies was measured for Raman spectrum according to the same method in Example 1, to calculate the strongest line intensity ratios $I_M/I_H$ and $I_{Cr}/I_M$, respectively. The values of $I_M/I_H$ and $I_{Cr}/I_M$ obtained at the respective measurement positions are summarized and shown in Table 2. It should be noted that, on the measurement target face of each magnetic base body, a part assuming a yellowish hue was observed near the center part 11, just like on the magnetic base body pertaining to Example 1 (the part assuming a yellow hue was observed in an area extending to the location (2) in Examples 1 and 2, whereas the part assuming a yellow hue was observed in an area predominantly at or near the location (1) in Examples 3 and 4).

(Manufacturing of Coil Components and Measurement of Specific Magnetic Permeabilities)

Coil components were manufactured from the obtained magnetic base bodies according to the same method in Example 1, and measured for specific magnetic permeability. The obtained specific magnetic permeabilities were 48 (Example 2), 46 (Example 3), and 44 (Example 4), respectively.

Comparative Examples 1, 2

(Manufacturing of Magnetic Base Bodies)

The magnetic base bodies pertaining to Comparative Examples 1, 2 were obtained in the same manner as in Example 1, except that the dimensions/shape of the compact were changed to a ring shape of 7.0 mm in outer diameter, 4.0 mm in inner diameter, and 1.0 mm in thickness (Comparative Example 1), and ring shape of 6.0 mm in outer diameter, 4.0 mm in inner diameter, and 1.0 mm in thickness (Comparative Example 2), respectively. The dimensions of the rectangular cross-section obtained by cutting the magnetic base body in the diameter direction of the ring, and the cross-section area of the magnetic base body, were 1.0 mm in the longitudinal direction and 1.5 mm in the lateral direction with the cross-section area being 1.5 mm$^2$ in Comparative Example 1, and 1.0 mm in both the longitudinal direction and lateral direction with the cross-section area being 1.0 mm$^2$ in Comparative Example 2.

(Raman Spectrometry of Magnetic Base Bodies)

Each of the obtained magnetic base bodies was measured for Raman spectrum according to the same method in Example 1, to calculate the strongest line intensity ratios $I_M/I_H$ and $I_{Cr}/I_M$, respectively. The values of $I_M/I_H$ and $I_{Cr}/I_M$ obtained at the respective measurement positions are summarized and shown in Table 2. It should be noted that the measurement target faces of the magnetic base bodies were uniformly black, and no part assuming a yellowish hue was observed which was seen on the magnetic base bodies pertaining to Examples 1 to 4.

(Manufacturing of Coil Components and Measurement of Specific Magnetic Permeabilities)

Coil components were manufactured from the obtained magnetic base bodies, respectively, according to the same method in Example 1, and measured for specific magnetic permeability. The obtained specific magnetic permeabilities were 40 in both Comparative Examples 1, 2.

The results of the Examples and Comparative Examples explained above are summarized and shown in Tables 1 and 2.

TABLE 1

| | Dimensions of magnetic base body | | | |
|---|---|---|---|---|
| | Outer diameter (mm) | Inner diameter (mm) | Thickness (mm) | Cross-section area of magnetic base body (mm$^2$) |
| Example 1 | 10.0 | 4.0 | 3.0 | 9.0 |
| Example 2 | 9.0 | 4.0 | 2.5 | 6.3 |
| Example 3 | 8.0 | 4.0 | 2.0 | 4.0 |
| Example 4 | 7.0 | 4.0 | 1.5 | 2.3 |
| Comparative Example 1 | 7.0 | 4.0 | 1.0 | 1.5 |
| Comparative Example 2 | 6.0 | 4.0 | 1.0 | 1.0 |

TABLE 2

| | $I_M/I_H$ | | | | $I_{Cr}/I_M$ | | | | μ at 1 MHz |
|---|---|---|---|---|---|---|---|---|---|
| | Measurement position (1) | Measurement position (2) | Measurement position (3) | Surface of magnetic base body | Measurement position (1) | Measurement position (2) | Measurement position (3) | Surface of magnetic base body | |
| Example 1 | 19.50 | 7.00 | 1.67 | 1.36 | 0.006 | 0.005 | 0.005 | 0.005 | 52 |
| Example 2 | 7.60 | 3.42 | 1.64 | 1.42 | 0.011 | 0.009 | 0.016 | 0.016 | 48 |
| Example 3 | 2.51 | 1.98 | 1.64 | 1.55 | 0.030 | 0.018 | 0.023 | 0.022 | 46 |
| Example 4 | 2.20 | 1.88 | 1.64 | 1.62 | 0.030 | 0.018 | 0.023 | 0.022 | 44 |
| Comparative Example 1 | 1.72 | 1.69 | 1.65 | 1.71 | 0.122 | 0.142 | 0.132 | 0.095 | 40 |
| Comparative Example 2 | 1.67 | 1.70 | 1.60 | 1.75 | 0.146 | 0.154 | 0.162 | 0.074 | 40 |

From the above results, a magnetic base body formed by metal magnetic grains containing Fe, Si and Cr can achieve high specific magnetic permeability when its intensity ratio ($I_M/I_H$) of the strongest line intensity ($I_M$) in a range of wavenumbers 650 to 750 cm$^{-1}$, to the strongest line intensity ($I_H$) in a range of wavenumbers 400 to 450 cm$^{-1}$, in a Raman spectrum measured at the center part is 2 or higher, and when it has a part on the surface side of the center part where the aforementioned intensity ratio ($I_M/I_H$) in a Raman spectrum is under 2 (preferably 1.5 or less), wherein a difference in the intensity ratio ($I_M/I_H$) between the center part and the surface side is preferably 0.5 or more. This magnetic base body demonstrates excellent electrical insulating property owing to a high percentage, on the surface side, of hematite with excellent electrical insulating property.

As demonstrated in the above examples, since the intensity ratio ($I_M/I_H$) (also the intensity ratio ($I_{Cr}/I_M$)) is a function of the amount of oxygen available for forming an oxide (and also the temperature) and oxygen is supplied from the surrounding atmosphere through the surface toward the center part, the size and the shape of the magnetic base body (including a specific surface area, an aspect ratio of a cross-section, and the like) can be used as control parameters to manipulate the intensity ratio(s) so as to fall within desired ranges through routine experimentation based on the present disclosure. In any event, in the present disclosure where conditions and/or structures are not specified, a skilled artisan in the art can readily provide such conditions and/or structures, in view of the present disclosure, as a matter of routine experimentation.

INDUSTRIAL APPLICABILITY

According to the present invention, a coil component comprising, as a magnetic base body, a powder magnetic core having excellent electrical insulating property and high magnetic permeability, can be provided. This permits performance enhancement or size reduction of the coil component as well as any circuit board on which it is installed, and the present invention is useful in this respect.

I claim:

1. A coil component, comprising:
   a magnetic base body formed by metal magnetic grains containing Fe, Si, and Cr, whose intensity ratio ($I_M/I_H$) of a strongest line intensity ($I_M$) in a range of wavenumbers 650 to 750 cm$^{-1}$, to a strongest line intensity ($I_H$) in a range of wavenumbers 400 to 450 cm$^{-1}$, in a Raman spectrum measured at a center part of the magnetic base body is 2 or higher, and which also has a part on a surface side of the center part where the intensity ratio ($I_M/I_H$) in a Raman spectrum is under 2; and
   a conductor placed inside or on a surface of the magnetic base body.

2. The coil component according to claim 1, wherein the intensity ratio ($I_{Cr}/I_M$) of the strongest line intensity ($I_{Cr}$) in a range of wavenumbers 525 to 575 cm$^{-1}$, to the strongest line intensity ($I_M$), in a Raman spectrum measured at the center part is 0.05 or lower.

3. The coil component according to claim 1, wherein an Fe content in the metal magnetic grains is 90% by mass or higher.

4. The coil component according to claim 1, wherein the intensity ratio ($I_M/I_H$) at the center part is at least 0.5 greater than the intensity ratio ($I_M/I_H$) at the part on the surface side.

5. The coil component according to claim 1, wherein the magnetic base body has a magnetic permeability μ of more than 40 as measured at 1 MHz.

6. The coil component according to claim 2, wherein an Fe content in the metal magnetic grains is 90% by mass or higher.

7. The coil component according to claim 1, wherein the magnetic base body is an integrally molded body.

8. A circuit board on which the coil component of claim 1 is mounted.

* * * * *